(12) United States Patent
Lin et al.

(10) Patent No.: US 8,836,082 B2
(45) Date of Patent: Sep. 16, 2014

(54) REVERSAL LITHOGRAPHY APPROACH BY SELECTIVE DEPOSITION OF NANOPARTICLES

(75) Inventors: Qin Lin, Rolla, MO (US); Daniel M. Sullivan, Vichy, MO (US); Hao Xu, Carnas, WA (US); Tony D. Flaim, St. James, MO (US)

(73) Assignee: Brewer Science Inc., Rolla, MO (US)

( * ) Notice: Subject to any disclaimer, the term of this patent is extended or adjusted under 35 U.S.C. 154(b) by 702 days.

(21) Appl. No.: 13/017,903

(22) Filed: Jan. 31, 2011

(65) Prior Publication Data

US 2012/0193762 A1    Aug. 2, 2012

(51) Int. Cl.
| | |
|---|---|
| *H01L 29/02* | (2006.01) |
| *B82Y 10/00* | (2011.01) |
| *B82Y 30/00* | (2011.01) |

(52) U.S. Cl.
CPC *B82Y 30/00* (2013.01); *B82Y 10/00* (2013.01)
USPC ................. 257/618; 438/42; 438/61; 438/71; 438/98; 438/653

(58) Field of Classification Search
USPC ........ 257/618, E29.002, E31.13, E21.158, 99
See application file for complete search history.

(56) References Cited

U.S. PATENT DOCUMENTS

| | | | |
|---|---|---|---|
| 4,973,544 | A | 11/1990 | Slayman et al. |
| 5,911,110 | A | 6/1999 | Yu |
| 6,221,777 | B1 | 4/2001 | Singh et al. |
| 6,277,544 | B1 | 8/2001 | Singh et al. |
| 2010/0175749 | A1* | 7/2010 | Tsutsumi et al. ............. 136/256 |
| 2010/0236620 | A1* | 9/2010 | Nakanishi et al. ........... 136/256 |

OTHER PUBLICATIONS

Xia, "Fabrication of enclosed nanochannels using silica nanoparticles," Journal of Vac. Sci. Technol., B23(6) 2005, 2694-2699.

Xia et al., "Lithographically directed deposition of silica nanoparticles using spin coating," Journal Vac. Sci. Technol., B22(6) 2004, 3415-3420.

Xia et al., "Directed Self-Assembly of Silica Nanoparticles into Nanometer-Scale Patterned Surfaces Using Spin Coating," Adv. Mater. Aug. 18, 2004, 16, No. 16, 1427-1432.

Van Der Meeren et al., "Colloid-membrane interaction effects on flux decline during cross-flow ultrafiltration of colloidal silica on semi-ceramic membranes," Phys. Chem. Chem. Phys., 2004, vol. 6, 1408-1412.

\* cited by examiner

*Primary Examiner* — Chuong A Luu
*Assistant Examiner* — Rodolfo Fortich
(74) *Attorney, Agent, or Firm* — Hovey Williams LLP

(57) ABSTRACT

A novel reversal lithography process without etch back is described. The reversal material comprises nanoparticles that are selectively deposited into the gaps between features without overcoating the tops of the features. As a result, a patterned imaging layer can be removed using solvent, blanket exposure followed by developer washing, or dry etching directly, without an etch-back process, and the original bright field lithography pattern can be reversed into dark field features, and transferred into subsequent layers using the nanoparticle reversal material as an etch mask.

21 Claims, 7 Drawing Sheets

US 8,836,082 B2

REVERSAL LITHOGRAPHY APPROACH BY SELECTIVE DEPOSITION OF NANOPARTICLES

BACKGROUND OF THE INVENTION

1. Field of the Invention

The present invention relates to microelectronics structures and a pattern reversal method of forming dark field features using bright field lithography.

2. Description of Related Art

As the semiconductor industry continues to advance, development of a photolithography method to shrink features, such as trenches and holes is urgently needed. Some ancillary methods have been developed to help push the progress of photolithography. For bright field lithography, in which only small portions of the photoresist, such as lines, are protected from the exposure and remain after development, overexposing can be used to shrink the size of the features. Moreover, one can also trim features by dry etching to reduce their width. Those technologies are effective down to features smaller than 32 nm. However, no comparable method exists to shrink trenches, spaces, or holes (e.g., contact, via). In addition, these methods still face the issue of feature collapse as features get smaller and smaller. One way to address the problem of feature collapse is to use thinner and thinner photoresist layers. However, the very thin photoresist layer is not sufficiently etch resistant, thereby causing problems during pattern transfer.

In current integrated circuit (IC) production, trenches and contacts holes are fabricated using dark field lithography in which a large portion of the photoresist is protected from exposure, while only small portions of the photoresist are exposed and removed after development. Dark field lithography and its ancillary technologies, such as resist reflow or Resolution Enhancement Lithography Assisted by Chemical Shrink (RELACS), have serious technical difficulties to overcome in order to retain good critical dimension (CD) control when features are 45 nm or smaller. An effective method for fabricating dark field features, such as trenches and holes, is urgently needed to achieve progress in light field lithography.

Reversal lithography, an approach to forming dark field features based on bright field lithography technology, has been proposed as one alternate strategy. For this approach, a template is first patterned on the substrate for example, using a photoresist and bright field lithography. Next, a material that etches much slower in oxygen plasma than the photoresist is coated on the template, filling the holes and trenches and overcoating the tops of the features (e.g., lines) formed in the photoresist. Because the tops of features are always overcoated in this process, an etch-back process is then necessary to open the cap of the features. After the tops of the features are clear, oxygen etching is used to remove the photoresist without significantly etching the reversal material, which remains on the substrate. As a result, the original photoresist features created by the bright field lithography are reversed into dark field features, such as trenches. However, this method has not achieved wide acceptance due to its process complexity and the required etch-back steps, which greatly increase cost. To minimize the amount of etch-back required, a coating that is as thin as possible has been proposed. However, this raises other issues, such as coating uniformity. That is, when a thin coating is applied on a surface with different features, the size and density of the features have a strong impact on coating thickness. The uneven thickness causes defects to be generated during subsequent etch processes, which is still a serious obstacle for this technology to be accepted by the industry. Thus, there remains a need for a method of producing dark field features, such as trenches and holes at features sizes below 45 nm.

SUMMARY OF THE INVENTION

The present invention is broadly concerned with a method of forming a microelectronic structure. The method comprises providing a wafer stack that comprises a substrate having a surface, one or more intermediate layers optionally formed on the substrate surface, a patterned imaging layer formed on the intermediate layers if present, or on the substrate surface if no intermediate layers are present. The patterned imaging layer comprises a plurality of features, the features each being defined by respective sidewalls and a top surface. Next, a pattern reversal composition is applied to the patterned imaging layer to form a pattern reversal mask. The pattern reversal composition comprises nanoparticles dispersed in a solvent system. Advantageously, the nanoparticles are selectively deposited between the features during the application of the composition without overcoating the top surfaces of the features. Then, the patterned imaging layer is removed to yield a reversed pattern comprising the mask. The reversed pattern is then transferred into the intermediate layers if present, or into the substrate if no intermediate layers are present.

The invention is also concerned with a microelectronic structure. The structure comprises a substrate having a surface, one or more intermediate layers optionally formed on the substrate surface, a patterned imaging layer formed on the intermediate layers if present, or on the substrate surface if no intermediate layers are present, and a pattern reversal mask. The patterned imaging layer comprises a plurality of features, each being defined by respective sidewalls and top surfaces. The pattern reversal mask is deposited between the features and adjacent the feature sidewalls, but is absent from the top surfaces of the features (i.e., does not overcoat the top surfaces). The mask comprises nanoparticles having a particle size of less than 10 nm.

A further method of forming a microelectronic structure is also provided. The method comprises providing a wafer stack that comprises a substrate having a surface, one or more intermediate layers optionally formed on the substrate surface, a patterned imaging layer formed on the intermediate layers if present, or on the substrate surface if no intermediate layers are present. The patterned imaging layer comprises a plurality of features, the features each being defined by respective sidewalls and a top surface. Next, a pattern reversal composition comprising nanoparticles dispersed in a solvent system is applied to the patterned imaging layer to form a pattern reversal mask. Without altering the pattern reversal mask, the patterned imaging layer is then removed to yield a reversed pattern comprising the mask. The reversed pattern is then transferred into the intermediate layers if present, or into the substrate if no intermediate layers are present.

DETAILED DESCRIPTION

Figure 1:
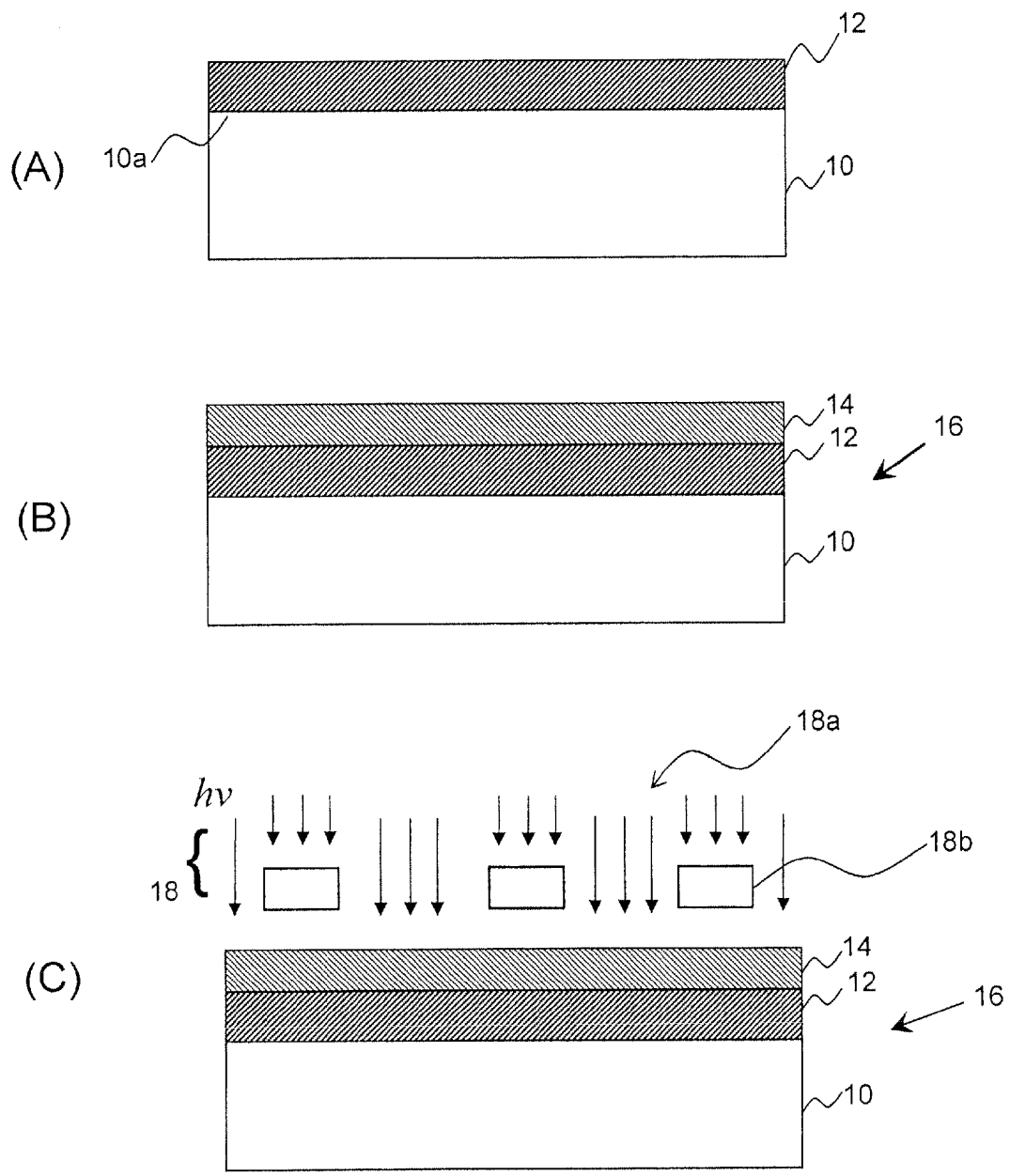
FIGS. 1(A)-(G) are schematic drawings depicting a structure (not to scale) formed by the inventive process.
Figure 1:
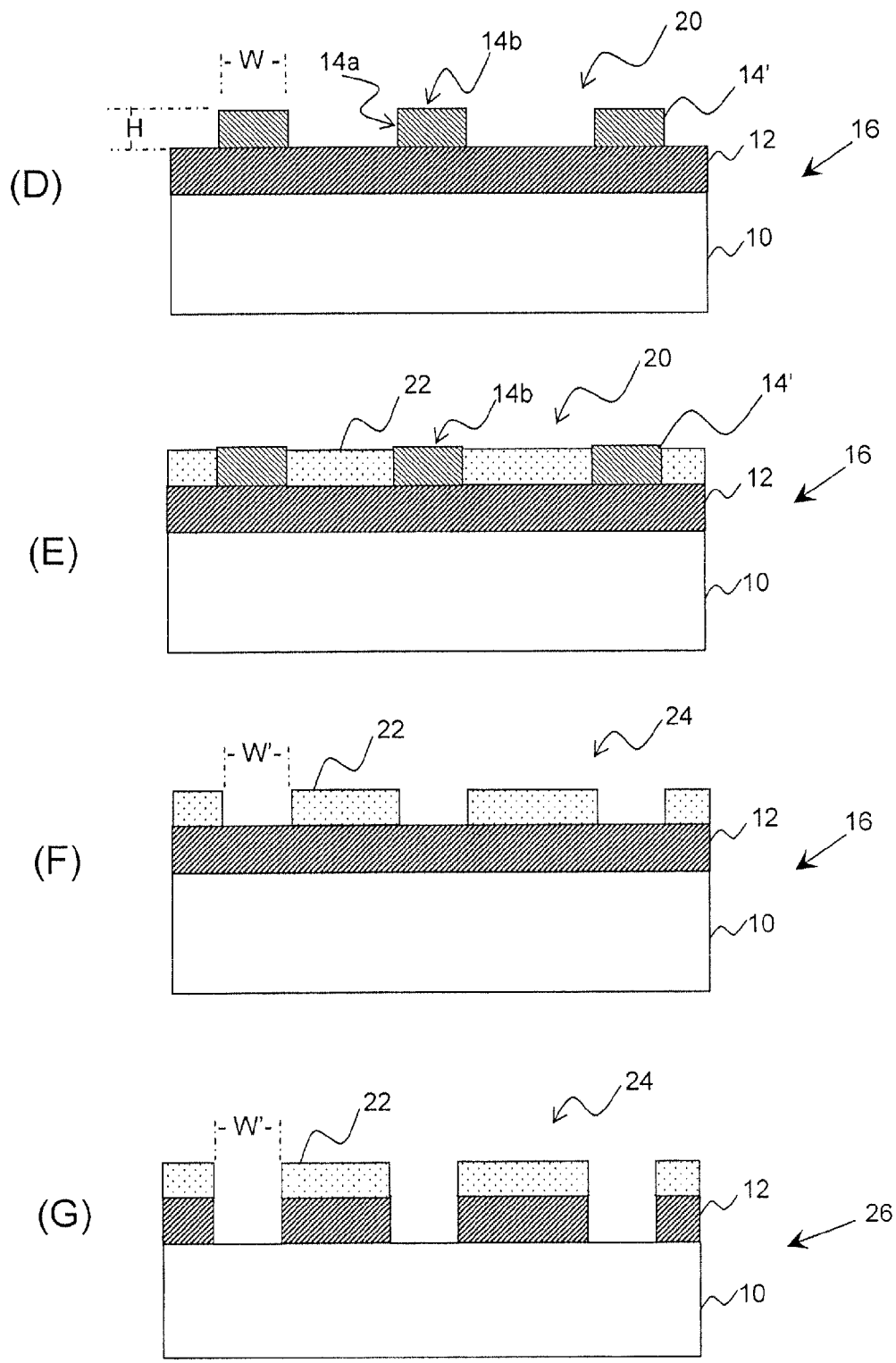

The present invention is concerned with reversal lithography in which dark field features are created on microelectronic substrates using bright field lithography processes and a novel pattern reversal method. In general, a wafer stack having a patterned imaging layer is provided that has a plurality of features formed therein. An image reversal material is applied to the patterned imaging layer, and specifically into the gaps between the imaging layer features, followed by removal of the imaging layer resulting in reversal of the pattern. This reversed pattern is then transferred into subsequent layers.

A preferred embodiment of the present invention is described in detail below with reference to FIGS. 1(A)-(G). While the drawings illustrate, and the specification describes, certain preferred embodiments of the invention, it is to be understood that such disclosure is by way of example only. Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. There is no intent to limit the principles of the present invention to the particular disclosed embodiments. For example, in the drawings, the size and relative sizes of layers and regions may be exaggerated for clarity. In addition, embodiments of the present invention should not be construed as limited to the particular shapes of regions illustrated herein but are to include deviations in shapes that result, for example, from manufacturing. For example, an etched region illustrated as a rectangle may have rounded or curved features. Thus, the regions illustrated in the figures are schematic in nature and their shapes are not intended to illustrate the precise shape of a region of a device and are not intended to limit the scope of the present invention.

METHODS OF THE INVENTION

In more detail, referring to FIG. 1(A), a substrate 10 having a surface 10a is provided. Any microelectronic substrate 10 can be used in the invention. Exemplary substrates 10 include those selected from the group consisting of silicon, SiGe, $SiO_2$, $Si_3N_4$, aluminum, tungsten, tungsten silicide, gallium arsenide, germanium, tantalum, tantalum nitride, coral, black diamond, phosphorous or boron doped glass, and mixtures of the foregoing. One or more intermediate layers 12 can be optionally formed on the substrate surface 10a. Suitable intermediate layers 12 are selected from the group consisting of anti-reflective layers, spin-on carbon (SOC) layers, amorphous carbon layers, hardmask layers, planarization layers, and combinations thereof. When anti-reflective layers are used, the intermediate layer 12 preferably has a thickness of from about 10 nm to about 100 nm, and more preferably from about 20 nm to about 50 nm. When spin-on carbon layers are used, the intermediate layer 12 preferably has a thickness of from about 100 nm to about 500 nm, and more preferably from about 150 nm to about 300 nm. When hardmask layers are used, the intermediate layer 12 preferably has a thickness of from about 10 nm to about 100 nm, and more preferably from about 20 nm to about 50 nm. Regardless, the substrate 10 can comprise a planar surface, or it can include topography (via holes, contact holes, trenches, lines, raised features, etc.). As used herein, "topography" refers to the height or depth of a structure in or on a substrate surface.

As shown in FIG. 1(B), a photosensitive composition can then be applied to the intermediate layer 12, if present, or to the substrate surface 10a, if no intermediate layers 12 are present to form an imaging layer 14 on the stack 16. Suitable photosensitive compositions for use as the imaging layer 14 include any compositions that contain a photoacid generator, or can be patterned upon exposure to at least about 1 mJ/cm$^2$, such as photoresists, and anti-reflective imaging layers. The imaging layer 14 can then be post-application baked ("PAB") at a temperature of at least about 80° C., preferably from about 100° C. to about 130° C., and for time periods of from about 10 seconds to about 120 seconds (preferably from about 45 seconds to about 60 seconds). The thickness of the imaging layer 14 is preferably from about 10 nm to about 200 nm, more preferably from about 50 nm to about 100 nm, and even more preferably from about 60 nm to about 80 nm. The imaging layer 14 can then be patterned, for example, by exposure to radiation (light) of the appropriate wavelength, followed by development of the exposed portions of the imaging layer 14. Multiple exposures could also be used. In one embodiment, as shown in FIG. 1(C), the imaging layer 14 is exposed using a mask 18 positioned above the imaging layer 14. The mask 18 has open areas 18a designed to permit radiation (hv) to pass through the mask 18 and contact the imaging layer 14 to yield exposed portions of the imaging layer that are rendered developer soluble. The remaining solid portions 18b of the mask 18 are designed to prevent radiation from contacting the imaging layer 14 in certain areas to yield unexposed portions of the imaging layer. Those skilled in the art will readily understand that the arrangement of open areas 18a and solid portions 18b is designed based upon the desired pattern to be formed in the imaging layer 14, although the present method is particularly suited for bright field exposure where the majority of the imaging layer 14 is exposed to radiation to form features such as lines and pillars. After exposure, the imaging layer 14 is preferably subjected to a post-exposure bake ("PEB") at a temperature of from about 80° C. to about 130° C., more preferably from about 100° C. to about 120° C., for a time period of from about 45 seconds to about 90 seconds.

Upon exposure, the portions of the imaging layer 14 that are exposed to radiation are rendered soluble in aqueous developer. As shown in FIG. 1(D), the exposed portions of the imaging layer 14 that were made soluble by the above process, are then contacted with an aqueous developer to remove the exposed portions to form the desired pattern 20 in the imaging layer 14. Alternatively, the exposed portions of the imaging layer 14 can be rendered insoluble during the exposure process, in which case, the removal process is reversed from what is described above. That is, the unexposed portions are removed during development to form the pattern (not shown). In either embodiment, at least about 95% of the exposed (or unexposed as the case may be) portions of the imaging layer 14 will preferably be removed by the developer, more preferably at least about 99%, and even more preferably about 100% will be removed. Suitable developers are organic or inorganic alkaline solutions such as potassium hydroxide (KOH) and tetramethyl ammonium hydroxide (TMAH), and preferably comprise an aqueous solution of TMAH at a concentration of 0.26N or lower. Some of these developers are commercialized under the tradenames PD523AD (available from Moses Lake Industries, Inc., Moses Lake, Wash.), MF-319 (available from Shipley, Mass.), MF-320 (available from Shipley), and NMD3 (available from TOK, Japan).

The pattern 20 preferably comprises features selected from the group consisting of lines, spaces, pillars, trenches, holes, and combinations thereof. These features are each defined by respective sidewalls 14a and respective top surfaces 14b. It will be appreciated that any suitable patterning process may be used to pattern the imaging layer 14, including multiple patterning processes, as well as immersion lithography. As mentioned above, it will also be appreciated that a negative-tone resist or photosensitive material could also be used, instead of the positive-tone imaging layer 14 described herein. In that case, the exposed portions of the imaging layer 14 are rendered insoluble, while the unexposed portions remain soluble and are removed with developer. Other patterning methods may also be used, including emerging technologies, such as imprint lithography, nano-imprint lithography, hot embossing lithography, and stamping pattern transfer. These technologies use a patterned mold to transfer patterns instead of relying on photolithographic patterning, as described above.

Regardless of the embodiment, the feature size of the resulting patterned imaging layer 14' will preferably be less than about 100 nm, more preferably from about 5 nm to about 100 nm, even more preferably from about 5 nm to about 90 nm, and most preferably from about 10 nm to about 60 nm. The term "feature size," as used herein, refers to the width "W" of the features, such as trenches, as measured on an SEM cross-section of the substrate or layer 14 (thus in the case of via holes, the width is the same as the hole diameter). Features of the pattern 20 may also be trimmed to further decrease their size, as desired, before proceeding with subsequent processing. The height "H" of the features (which also corresponds to the thickness of the patterned imaging layer 14') will preferably range from about 10 nm to about 200 nm, more preferably from about 20 nm to about 100 nm, and even more preferably from about 30 nm to about 80 nm.

Next, a nanoparticle pattern reversal composition is applied to the patterned imaging layer 14'. The pattern reversal composition is preferably applied via spin coating at speeds of from about 500 rpm to about 5,000 rpm, preferably from about 800 rpm to about 3,000 rpm, and for time periods of from about 30 seconds to about 120 seconds, preferably from about 45 seconds to about 60 seconds. The nanoparticle composition is then baked at a temperature sufficient to drive off solvents and effect a slight curing of the composition to yield a cured or dried pattern reversal mask 22. Preferably the composition is baked at a temperature of from about 80° C. to about 130° C., preferably from about 90° C. to about 120° C., and more preferably from about 100° C. to about 110° C., for a time period of from about 30 seconds to about 120 seconds, and preferably from about 45 seconds to about 60 seconds. Advantageously, as shown in FIG. 1(E), the nanoparticles in the composition are selectively deposited into the gaps between the features of the patterned imaging layer 14' and adjacent the respective feature sidewalls 14b. That is, the nanoparticles in the composition preferably do not substantially overcoat the pattern 20, as in the prior art, and more preferably result in no overcoating of the pattern 20. More specifically, the thickness of the pattern reversal mask 22 is preferably less than or equal to the height, "H," of the features of the patterned imaging layer 14'. Thus, the thickness of the pattern reversal mask 22 is preferably about 20 nm less than the height "H" of the features of the patterned imaging layer 14', more preferably about 10 nm less than the height "H" of the features of the patterned imaging layer 14', and even more preferably about 5 nm less than the height "H" of the features of the patterned imaging layer 14' (where the height "H" also corresponds to the thickness of the patterned imaging layer 14' discussed above). More specifically, the thickness of the pattern reversal mask 22 is preferably from about 5 nm to about 180 nm, more preferably from about 15 nm to about 80 nm, and even more preferably from about 25 nm to about 70 nm. As a result, the top surface 14b of the features of the patterned imaging layer 14' remain open to be easily removed via solvent removal or etching, without the need for an etch-back step or other modification of the imagine layer 14' to expose the pattern 20 (i.e., in the resulting structure, the as-deposited, unaltered nanoparticles are absent from and do not coat or cover the top surface 14b of the features). That is, the pattern reversal mask 22 is not etched-back, polished, removed, or otherwise altered after formation, but is immediately ready for subsequent processing and pattern transfer, as described below.

Without altering the pattern reversal mask 22, the patterned imaging layer 14' can then be optionally removed by immersing the stack 16 in a suitable solvent for a time period of from about 60 to about 120 seconds, and preferably for a time period of from about 80 to about 90 seconds, followed by spin drying at from about 2,000 rpm to about 5,000 rpm (preferably from about 3,000 rpm to about 4,000 rpm) for from about 30 to about 120 seconds (and preferably from about 45 seconds to about 60 seconds). Suitable solvents for removing the imaging layer 14' are selected from the group consisting of PGMEA, ethyl lactate, cyclohexanone, gamma-butyrolactone, and mixtures thereof. Alternatively, the patterned imaging layer 14' can be removed using an etching process, such as the 0, etching process described below. In a further embodiment, the patterned imaging layer 14' can be removed using a blanket exposure at the appropriate wavelength, followed by a PEB and developer wash, as described above for pattern formation.

Regardless of the embodiment, removal of the imaging layer 14' results in the reversal of the pattern 20 to create a reversed pattern 24 in the reversal mask 22, comprising reversed features such as trenches and holes, traditionally created using a dark field process, as shown in FIG. 1(F). The reversed features of the reversed pattern 24 correspond to the features formed in the patterned imaging layer 14' and will have the same feature size, "W'," as discussed above with respect to the feature size, "W," of the pattern 20 features of the patterned imaging layer 14'. The reversed features also preferably have the same line roughness as the original pattern 20 features of the imaging layer 14'.

As shown in FIG. 1(G), an etching process (wet or dry) is then used to transfer the reversed pattern 24 from the reversal mask 22 into the intermediate layers 12, if present, and ultimately into the substrate 10. Preferably, reactive ion etching (RIE) is used to transfer the reversed pattern 24 using a reactive ion plasma of $CF_4$, $O_2$, HBr, $Cl_2$, $CHF_3$, $CH_3F_2$, $SF_6$, mixtures thereof, or combinations (i.e., where the gas is changed during the etching process) thereof. Advantageously, the reversal mask 22 is resistant to etching with $O_2$, and preferably etches at a rate of less than about 50 Å/min., more preferably less than about 20 Å/min., and even more preferably less than about 15 Å/min., when $O_2$ is used as the etchant. Thus, when the intermediate layer 12 is spin-on carbon, the etch selectivity of the reversal mask 22 over the intermediate layer 12 will be less than about 0.1, preferably less than about 0.05, and more preferably from about 0.01 to about 0.03, when 0, is used as the etchant. The $O_2$ resistance also facilitates removal of the imaging layer 14' via etching as described above.

In some embodiments, the reversal mask 22 is resistant to etching with $CF_4$, and preferably etches at a rate of less than about 400 Å/min., more preferably less than about 300 Å/min., and even more preferably less than about 200 Å/min., when $CF_4$ is used as the etchant. Thus, when the intermediate layer 12 is a hardmask, the etch selectivity of the reversal mask 22 over the intermediate layer 12 will be less than about 0.9, preferably less than about 0.5, and more preferably from about 0.3 to about 0.4, when $CF_4$ is used as the etchant.

COMPOSITIONS FOR USE IN THE INVENTION

The pattern reversal compositions for use in forming the reversal mask of the invention preferably comprise nanoparticles dispersed in a solvent system. More preferably, the composition consists essentially (or even consists) of nanoparticles dispersed in a solvent system. That is, the composition is preferably substantially non-polymeric (i.e., less than about 30% by weight polymeric ingredients, and more preferably less than about 10% by weight polymeric ingredients, based upon the total weight of the solids in the composition taken as 100% by weight). The term "polymeric," as used herein, refers to compounds comprising more than 200 monomeric repeat units and/or having a weight average molecular weight of greater than about 1,000 Daltons, more preferably greater than about 3,000 Daltons, and even more preferably greater than about 5,000 Daltons. Preferred nanoparticles are metal oxide nanoparticles, such as those selected from the group consisting of silica ($SiO_2$), alumina ($Al_2O_3$), $Sb_2O_5$, $ZrO_2$, $HfO_7$, $TiO_2$, $ZnO_2$, and mixtures thereof. Colloidal nanoparticles are particularly preferred for use in the invention. The nanoparticles will preferably have an average particle size of less than about 10 nm, more preferably from about 2 nm to about 9 nm, and even more preferably from about 4 nm to about 6 nm. The term "particle size," as used herein, refers to the maximum surface-to-surface dimension of the particles (e.g., for a spherical nanoparticle, the particle size would be its diameter). The nanoparticles will preferably have a Brunauer-Emmett-Teller (BET) surface area of from about 200 $m^2$/g to about 900 $m^2$/g, more preferably from about 250 $m^2$/g to about 800 $m^2$/g, and even more preferably from about 300 $m^2$/g to about 700 $m^2$/g. In some embodiments, the nanoparticles can also comprise a metal oxide coating. Suitable metal oxide coatings are selected from the group consisting of alumina, $Sb_2O_5$, $ZrO_2$, $HfO_2$, $TiO_2$, and $ZnO_2$. The metal oxide coating will preferably have a thickness of less than about 1 nm, and more preferably less than about 0.1 nm. In this embodiment, at least about 50% of the surface area of the nanoparticle should be covered with the metal oxide coating, and more preferably from about 90-100% of this surface area should be covered. When coated, the nanoparticle core preferably comprises at least about 90% by weight of the total coated nanoparticle, and more preferably from about 92% to about 95% by weight of the total coated nanoparticle, based upon the total weight of the coated nanoparticle taken as 100% by weight. Correspondingly, the coating preferably comprises at least about 10% by weight of the total coated nanoparticle, and more preferably from about 5% to about 8% by weight of the total coated nanoparticle, based upon the total weight of the coated nanoparticle taken as 100% by weight.

The composition preferably comprises from about 0.1% to about 10% by weight nanoparticles, more preferably from about 0.2% to about 5% by weight nanoparticles, and even more preferably from about 0.2% to about 3% by weight nanoparticles, based upon the total weight of the composition taken as 100% by weight. The pH of the composition is preferably from about 0 to about 12, more preferably from about 2 to about 11, and even more preferably from about 4 to about 10. When silica nanoparticles are used, it is particularly preferred that the pH ranges from about 8 to about 11. The composition will preferably have an ionic impurity concentration (as determined by inductively coupled plasma (ICP)) of less than about 200 ppb, more preferably from about 0.1 ppb to about 100 ppb, and even more preferably from about 1 ppb to about 50 ppb. It will be appreciated that a certain level of stabilizing non-metal counter ions is acceptable or even desired in the solvent system. Impurities include ions of sodium, potassium, calcium, magnesium, iron, chromium, nickel, aluminum, manganese, cobalt, copper, zirconium, tin, lithium, zinc, and mixtures thereof.

The solvent system should be selected so that it does not disrupt or dissolved the pattern formed in the imaging layer. Suitable solvents for use in the solvent system include water, water-soluble organic solvents (e.g., propylene glycol methyl ether acetate (PGMEA), propylene glycol monomethyl ether (PGME), ethyl lactate (EL), propylene glycol n-propyl ether (PnP), gamma-butyrolactone, cyclohexanone, and cyclopentanone), mesitylene, methyl iso-butyl carbinol (MIBC), and mixtures thereof. In one embodiment, the solvent system preferably consists essentially (or even consists) of water. In another embodiment, the solvent system comprises a mixture of water and at least one co-solvent other than water, preferably at least about 5% by weight of the non-water co-solvent, more preferably from about 5% to about 30% by weight of the non-water solvent, and even more preferably from about 10% by weight to about 20% by weight of the non-water co-solvent, based upon the total weight of the solvent system taken as 100% by weight. In this embodiment, the non-water co-solvent is preferably a water-soluble, organic solvent. In a further embodiment, the solvent comprises mesitylene, MIBC, or a mixture of mesitylene and MIBC, and optionally includes less than about 30% by weight of one or more organic co-solvents, such as PGME, PGMEA, EL, PnP, cyclohexanone, cyclopentanone, gamma-butyrolactone, preferably less than about 20% by weight, and more preferably from about 1% by weight to about 10% by weight of an organic co-solvent. These embodiments are particularly suited for use with positive-tone imaging layers. It will be appreciated that virtually any suitable solvent can be used with negative-tone imaging layers. Regardless of the embodiment, the solvent system is preferably used in the composition at a level of from about 90% to about 99.9% by weight, more preferably from about 95% to about 99.7% by weight, and even more preferably from about 97% to about 99.5% by weight, based upon the total weight of the composition taken as 100% by weight. The solvent system can also comprise stabilizing counter ions selected from the group consisting of ammonium, sodium, potassium, chloride, nitrate, acetate, and combinations thereof. The total solids of the composition can range from about 0.1% to about 10% by weight, more preferably from about 0.3% to about 5% by weight, and even more preferably from about 0.5% to about 3% by weight, based upon the total weight of the composition taken as 100% by weight.

The composition can also include additives such as adhesion promoters, surfactants, and combinations thereof. Suitable adhesion promoters can be used to improve the adhesion of the nanoparticle composition to the substrate and features, and include low-molecular-weight surfactants or polymers. Exemplary adhesion promoters include polyvinylpyrrolidone, Silwet 2-7604 copolymer, and mixtures thereof. When present, the adhesion promoter should be used in an amount of from about 0.1% to about 20% by weight, more preferably from about 0.5% to about 15% by weight, and even more preferably from about 1% to about 10% by weight, based upon the total weight of the composition taken as 100% by weight. The composition is formed by simply dispersing the nanoparticles and any other ingredients in the solvent system.

EXAMPLES

The following examples set forth methods in accordance with the invention. It is to be understood, however, that these examples are provided by way of illustration and nothing therein should be taken as a limitation upon the overall scope of the invention.

Example 1

Silica Nanoparticle Formulation I

In a 60.0 mL plastic bottle, 10.0 grams of NexSil® 5 nanoparticles (6 nm, 15 wt % Na-stabilized colloidal silica; Nyacol Nano Technologies, Inc., Ashland, Mass.) were diluted with 40.0 grams of deionized water. Next, 100.0 mg of Silwet L-7604 copolymer (Cromption Corporation, Greenwich, Conn.) was added as surfactant. The silica nanoparticle formulation (3% solids) was mixed until homogeneous, and bottled.

To prepare a patterned substrate, an acrylic-based anti-reflective coating material (ARC® 29A; Brewer Science, Inc., Rolla, Mo.) was spin coated at 2,500 rpm onto a silicon substrate and then baked at 205° C. for 60 seconds. An ArF photoresist (AM1682J; JSR Micro Inc., Sunnyvale, Calif.) was then coated at 3,200 rpm on top of the anti-reflective coating, followed by a PAB at 110° C. for 60 seconds. A mask was positioned above the photoresist layer and line/space patterns (1:3 pitch, CD=150 nm) were obtained using an Amphibian™ exposure tool (Amphibian Systems, Rochester, N.Y.), followed by development to yield a patterned photoresist layer.

Figure 2:
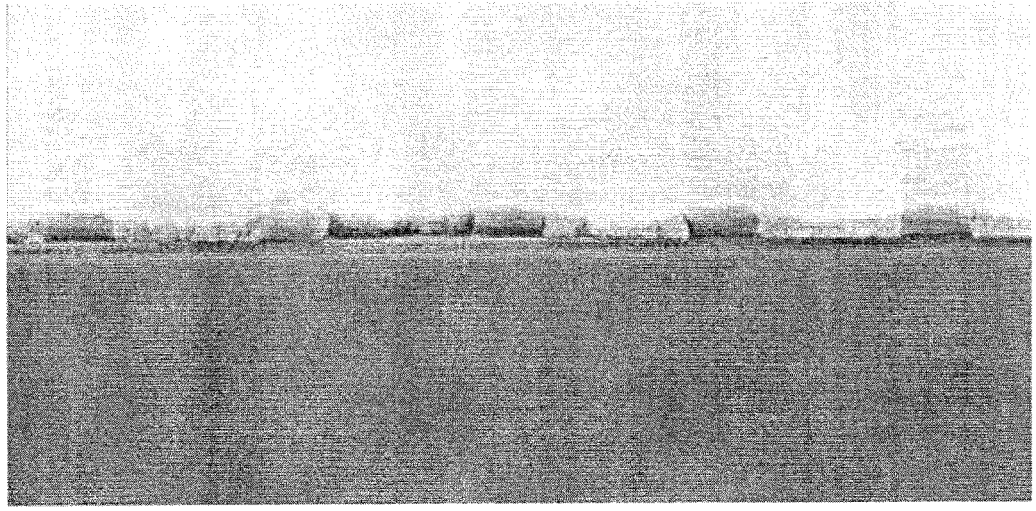
FIG. 2 is a scanning electron microscope (SEM) photograph showing a cross-sectional view of the substrate with the nanoparticles selectively deposited between features of a patterned photoresist as described in Example 1.

Next, the silica nanoparticle formulation prepared above was spin coated at 2,000 rpm on the patterned photoresist layer, followed by baking at 160° C. for 30 seconds. A cross-section SEM image (FIG. 2) shows that without any etch back, the silica nanoparticles selectively deposited into the patterned spaces formed in the photoresist layer and there was little to no deposition of the silica colloids on top of the patterned photoresist features.

Example 2

Silica Nanoparticle Formulation II

In this Example, another silica nanoparticle formulation was prepared and deposited onto a patterned substrate. First, 1 gram of Ludox® AS-30 (9 nm, 30 wt % colloidal silica nanoparticle suspension in water with ammonium stabilizing counter ion) was diluted using 17.0 grams of deionized water and 2.0 grams of PGME (Ultra Pure Solutions Inc., Castroville, Calif.). The formulation was mixed until homogeneous, and then filtered using a nylon filter with a pore size of 100 nm.

Next, a patterned substrate was prepared. First, a bottom layer of spin-on carbon ("SOC;" OptiStack® SOC 110; Brewer Science, Inc., Rolla, Mo.) was applied onto a silicon wafer. Next, a silicon-containing anti-reflective hardmask (OptiStack® HM710; Brewer Science, Inc., Rolla, Mo.), was applied on the top of the SOC layer, followed by a layer of photoresist (Pi-6001, TOK America, Hillsboro, Oreg.) and a PAB of 100° C. for 60 seconds. The photoresist layer was then patterned to form 34-nm lines with a pitch of 1:3 using and ArF immersion stepper (1900i from ASML, Veldhoven, Netherlands), followed by development of the photoresist layer using PD-523AD (0.26N TMAH, Moses Lake Industries, Inc., Moses Lake, Wash.).

Figure 3:
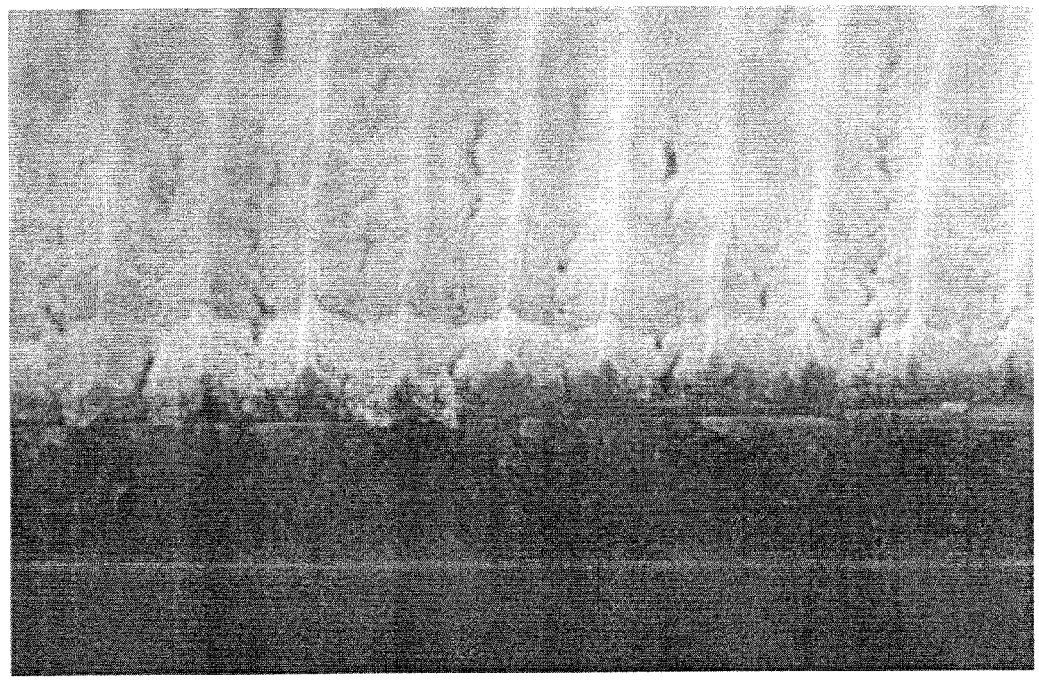
FIG. 3 is an SEM photograph showing a cross-sectional view of the substrate with the nanoparticles selectively deposited between features of a patterned photoresist as described in Example 2.

The silica nanoparticle formulation prepared above was then spin coated onto the patterned photoresist layer, followed by baking at 100° C. for 60 seconds. An SEM picture (FIG. 3) shows that nanoparticles were selectively deposited into the trenches between the photoresist lines (34 nm) to form a continuous film.

To test the etch resistance of the nanoparticle formulation in different gases, the silica nanoparticle formulation prepared above was also spin coated onto a flat (unpatterned) silicon wafer at 1,000 rpm, followed by baking at 100° C. for 60 seconds. The nanoparticle film was then subjected to etching using either $O_2$ or $CF_4$. The results of the etch resistance testing in fable 1 below demonstrate that the silica nanoparticle film was very resistant to oxygen etching.

TABLE 1

| | Thickness change (in nm) of Silica Nanoparticle Formulation II film | | |
|---|---|---|---|
| Etch gas | 30 seconds | 60 seconds | 120 seconds |
| $O_2$ | −0.2 | −0.2 | −0.3 |
| $CF_4$ | −20.3 | −44.4 | −85.4 |

Example 3

Silica Nanoparticle Formulation III

In this Example, a further silica nanoparticle formulation was prepared. First, 0.80 gram of Ludox® AS-30 colloidal silica suspension was diluted using 17.14 grams of deionized water and 2.0 grams of PGME (Ultra Pure Solutions, Inc., Castroville, Calif.). Next, 0.06 gram of polyvinylpyrrolidone (Aldrich, St. Louis, Mo.) was added to the solution. The formulation was mixed until homogeneous, and then filtered using a nylon filter with pore size of 100 nm.

Figure 4:
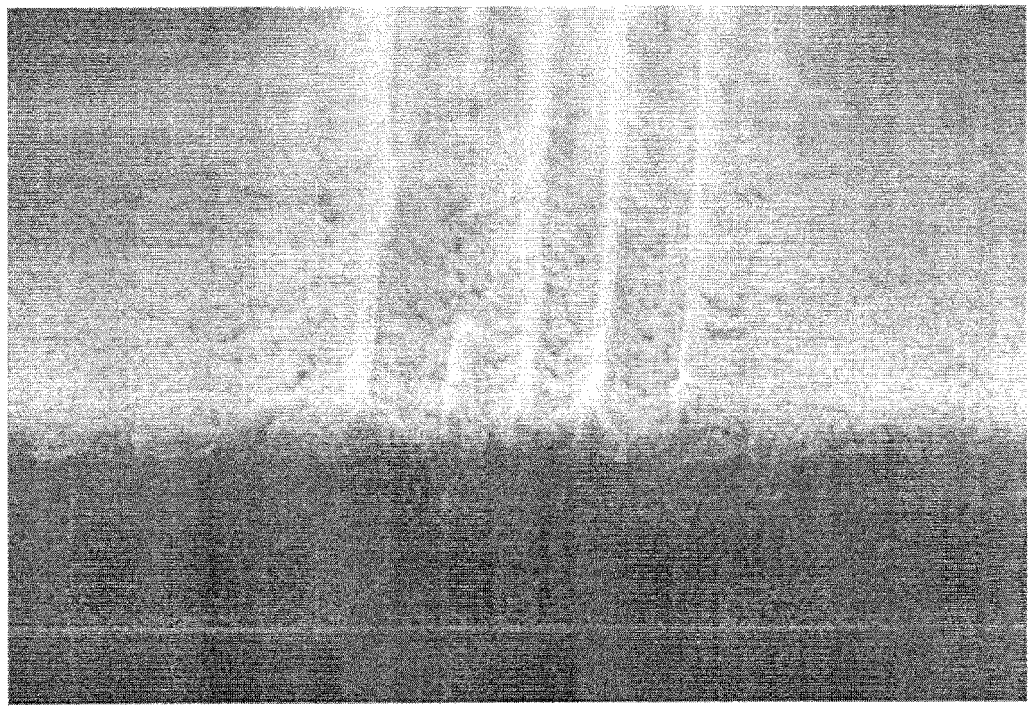
FIG. 4 is an SEM photograph showing a cross-sectional view of the substrate with the nanoparticles selectively deposited between features of a patterned photoresist as described in Example 3.

A patterned substrate was prepared according to the same procedure in Example 2. The silica nanoparticle formulation was then spin coated on the patterned photoresist layer at 2,000 rpm, followed by baking at 100° C. for 60 seconds. As shown in FIG. 4, the nanoparticle and polyvinylpyrrolidone formulation was selectively deposited into the trenches between the photoresist lines (34 nm) to form a continuous film. Compared to Example 2, this formulation demonstrated an improved adhesion to the photoresist lines.

Example 4

Alumina-Coated Silica Nanoparticle Formulation IV

In this Example, a nanoparticle formulation was prepared using Ludox® Cl (9 nm, 30 wt % alumina-coated, silica nanoparticle (26 wt % silica, 4 wt % alumina) suspension in water with chloride stabilizing counter ion; Aldrich, St. Louis, Mo.). First, 1 gram of Ludox® Cl was diluted with 8.0 grams of deionized water and 1.0 gram of PGME. The formulation was then spin coated onto an unpatterned silicon wafer at 1,000 rpm for etch testing in different gases, followed by baking at 100° C. for 60 seconds. The results are listed in Table 2 and demonstrate an improved $CF_4$ etch resistance without sacrificing oxygen etch resistance due to the presence of alumina on the surface of silica nanoparticles.

TABLE 2

| | Thickness change (in nm) of Silica Nanoparticle Formulation IV film | | |
|---|---|---|---|
| Etch gas | 30 seconds | 60 seconds | 120 seconds |
| $O_2$ | −0.6 | −0.6 | −0.8 |
| $CF_4$ | −14.3 | −29.9 | −54.7 |

Example 5

Silica Nanoparticle Formulation V

Figure 5:
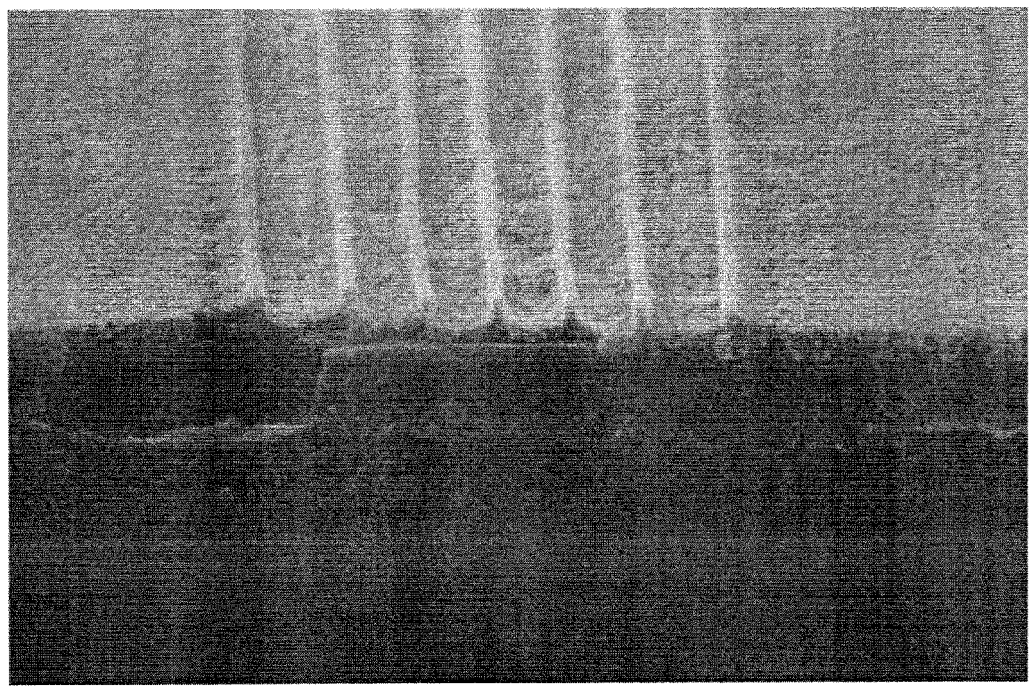
FIG. 5 is an SEM photograph showing a cross-sectional view of the substrate with the nanoparticles selectively deposited between features of a patterned photoresist as described in Example 5.

A silica nanoparticle formulation was prepared by dispersing 1 gram of Bindzil® 15/500 (5 nm, 15 wt % colloidal silica nanoparticle suspension in water; EKA Chemicals, Marietta, Ga.) in 8.0 grams of deionized water and 1 gram of PGME. The formulation was mixed until homogenous, and then filtered using a nylon filter with a pore size of 100 nm. Next, a patterned substrate was prepared according to the procedures in Example 2. The filtered formulation was then spin coated onto the patterned photoresist of the substrate at 2,000 rpm, followed by baking at 100° C. for 60 seconds. As shown in the SEM photograph in FIG. 5, the nanoparticles were selectively deposited into the trenches between the photoresist lines (34 nm) to form a continuous film.

The formulation was also spin coated onto an unpatterned silicon wafer, followed by baking at 100° C. for 60 seconds and etching using various etch gases. The results are shown in Table 3.

TABLE 3

| | Thickness change (in nm) of Silica Nanoparticle Formulation V film | | |
|---|---|---|---|
| Etch gas | 30 seconds | 60 seconds | 120 seconds |
| $O_2$ | −0.9 | −0.8 | −1.6 |
| $CF_4$ | −16.8 | −34.2 | −69.2 |
| $Cl_2$ | −1.1 | −4.2 | −9.8 |

Example 6

Silica Nanoparticle Formulation VI

In this Example, a further silica nanoparticle formulation was prepared by diluting 1 gram of Bindzil® 15/500 using 5.75 grams of deionized water and 0.75 gram of PGME. The resulting formulation was mixed until homogeneous, and then filtered using a nylon filter with a pore size of 100 nm. Next, a patterned substrate was prepared as in Example 2. The silica nanoparticle formulation was then spin coated onto the patterned photoresist of the substrate 2,000 rpm, followed by baking at 100° C. for 60 seconds.

Figure 6:
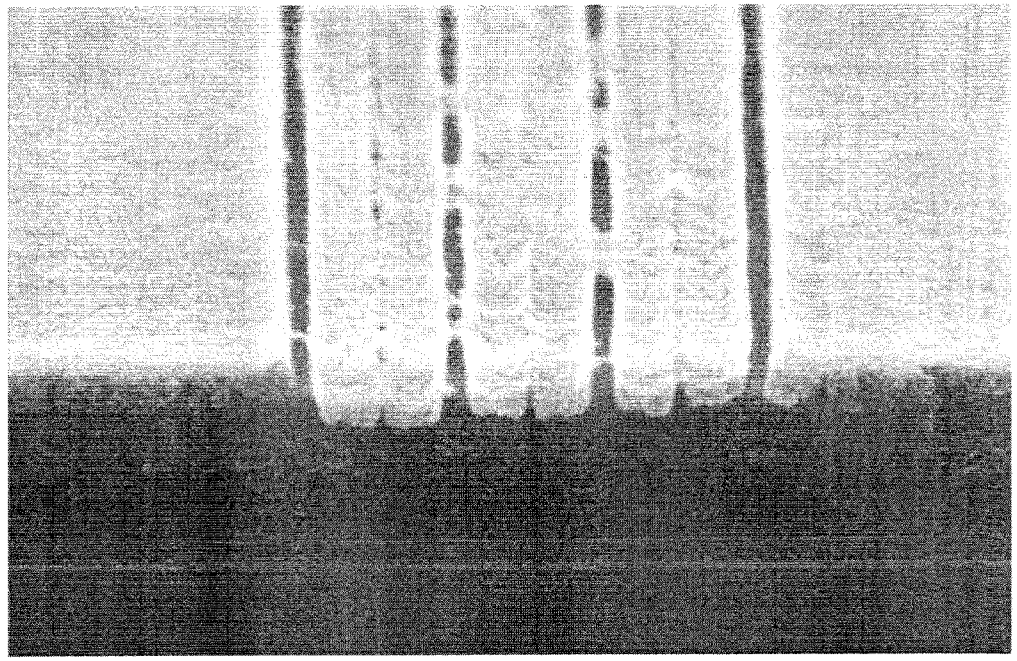
FIG. 6 is an SEM photograph showing a cross-sectional view of the substrate and reversal of the image after removal of the patterned photoresist as described in Example 6.

Next, the patterned and coated substrate was immersed into propylene glycol methyl ether acetate (PGMEA, Ultra Pure Solutions Inc., Castroville, Calif.) for 2 minutes, followed by spin washing three times using PGMEA to remove the photoresist, leaving behind the nanoparticle features. As shown in the SEM photograph in FIG. 6, the original photoresist pattern (34 nm lines with a pitch of 1:3), is reversed into 34-nm trenches with a pitch of 1:3 and similar line roughness. The nanoparticle reversal pattern could then be used as a mask to transfer the trench features into subsequent layers.

Example 7

Silica Nanoparticle Formulation VII

Figure 7:
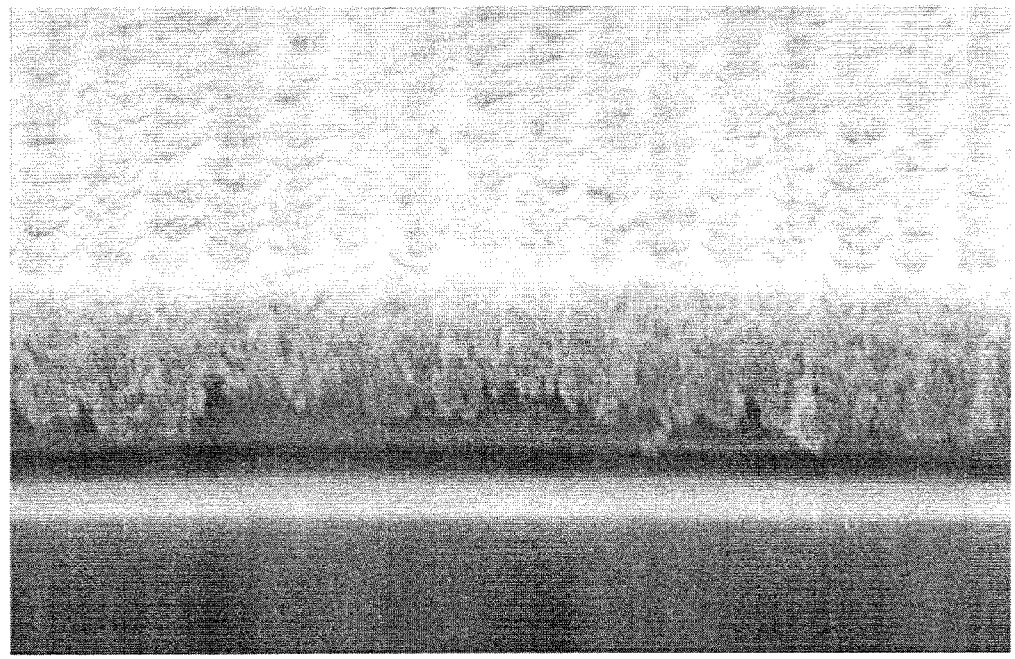
FIG. 7 is an SEM photograph showing a cross-sectional view of the substrate with the nanoparticles selectively deposited between features of a patterned photoresist as described in Example 7.

In this Example, a purified silica nanoparticle formulation was prepared by diluting 5 grams of Bindzil® 15/500 with 10 grams of deionized water. The solution was then stirred with ion exchange resin (Dowex® HCR-W2; Aldrich, St. Louis, Mo.) for two rounds of 10 minutes each to remove impurities. The pH value of the solution changed from 10 to 5. TMAH (20 wt % in water; Aldrich, St. Louis, Mo.) was added until the pH of the solution changed back to 10. The purified nanoparticle solution was then diluted using 30 grams of deionized water and 5 grams of PGME. The resulting formulation was mixed until homogenous, and then filtered using a nylon filter with a pore size of 100 nm. Next, a patterned substrate was prepared according to Example 2. The nanoparticle formulation was spin coated onto the patterned photoresist of the substrate at 2,000 rpm, followed by baking at 100° C. for 60 seconds. As shown in the SEM photograph in FIG. 7, the nanoparticles were selectively deposited into the trenches between the photoresist lines (30 nm) to form a continuous film without overcoating the features.

Figure 8:
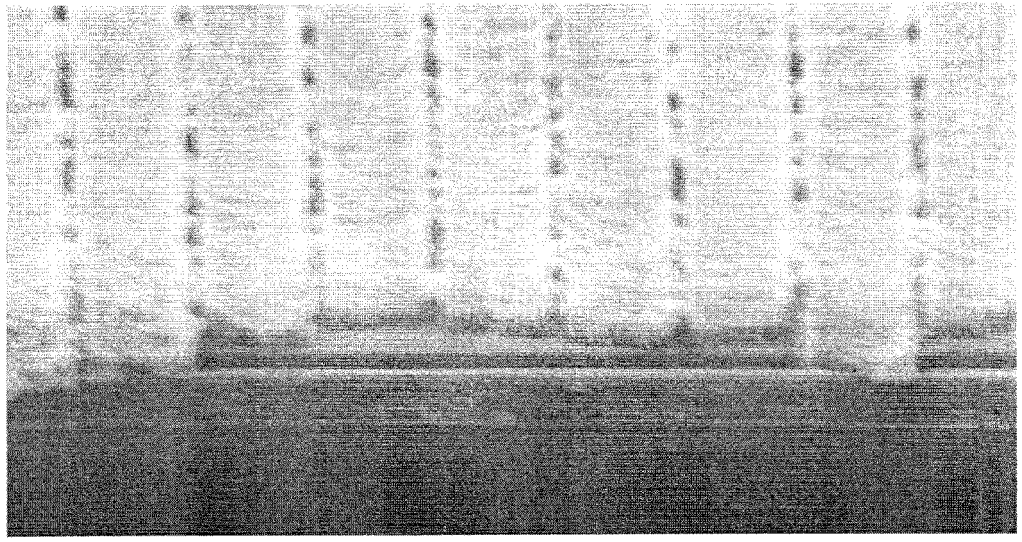
FIG. 8 is an SEM photograph showing a cross-sectional view of the substrate and reversal of the image after removal of the patterned photoresist as described in Example 7.

Next, the coated substrate was immersed in PGMEA for 120 seconds, followed by washing with PGMEA and spin drying several times to remove the photoresist. As shown in the SEM photograph in FIG. 8, the original pattern (34 nm lines with a 1:3 pitch) was reversed into 34-nm trenches with a 1:3 pitch.

Example 8

Ultra Pure Silica Nanoparticle Formulation

In this Example, an ultra pure silica nanoparticle formulation was prepared. First, 152.4 grams of plasma grade water (Fisher Scientific, Pittsburgh, Pa.) were mixed with 7.2 grams of TMAH (25 wt %, SACHEM Americas, Austin, Tex.) in a plastic bottle at 70° C. Next, 40.4 grams of tetraethyl orthosilicate (TEOS, 8N grade, Yamanaka EP Corp., Kyoto, JP) were added to the solution, which was then stirred for 24 hours at 70° C. Next, the solution was allowed to cool, and a 10-gram sample was removed to prepare the following formulation. The 10-gram sample was mixed with 26 grams of plasma grade water and 4 grams of PGME, followed by filtering using a nylon filter having a pore size of 100 nm. The ion content of the filtered formulation was below 100 ppb, as measured using a Varian Agilent ICP-MS.

Figure 9:
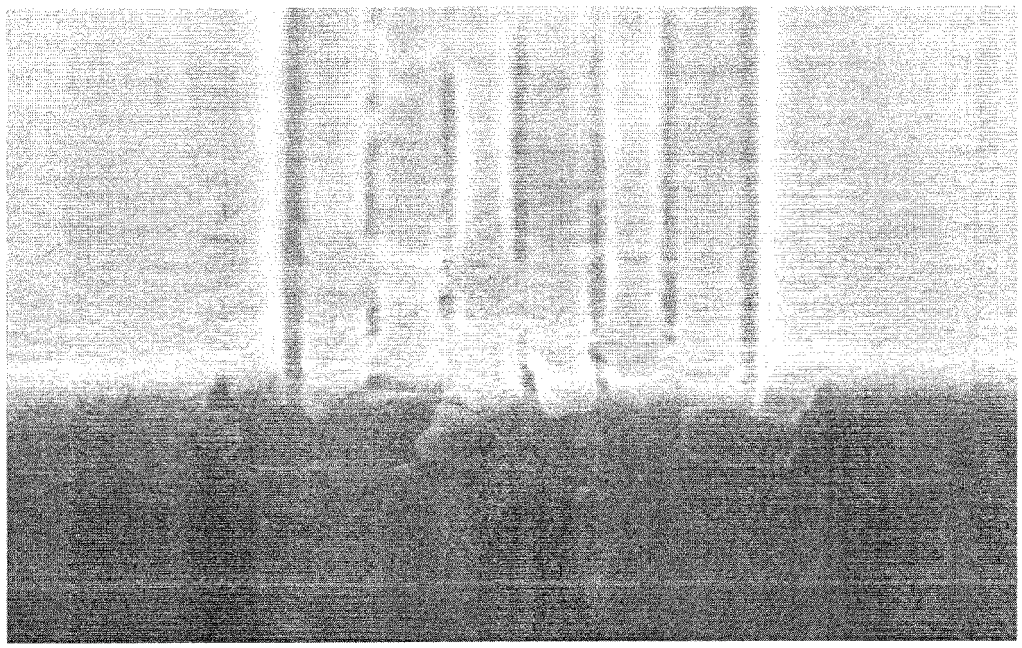
FIG. 9 is an SEM photograph showing a cross-sectional view of the substrate and reversal of the image after removal of the patterned photoresist as described in Example 8.

A patterned substrate was prepared according to Example 2. The nanoparticle formulation prepared above was spin coated onto the patterned photoresist of the substrate at different speeds, followed by baking at 100° C. for 60 seconds. The coated substrate was then immersed in PGMEA for 120 seconds, followed by washing with PGMEA and spin drying to remove the photoresist. As shown in the SEM photograph in FIG. 9, the original photoresist lines (34 nm) with a 1:3 pitch were reversed into 34-nm trenches with a 1:3 pitch.

Example 9

Etching of Reversal Image

Figure 10:
FIG. 10 is an SEM photograph showing a cross-sectional view of the substrate after etching of the reversed image into the hardmask layer as described in Example 9.

In this Example, a stack containing a reversal image prepared according to Example 8 was subjected to etching to transfer the reversed pattern into the hardmask and spin-on carbon layers of the stack. The stack was first etched using a reactive ion plasma of $CF_4$ ($CF_4$—35 sccm; power—100 W; pressure—100 mTorr) using an Oxford Plasmalab RIE for 30 seconds. As shown in the SEM photograph in FIG. 10, the 34-nm trenches with a 1:3 pitch were transferred into the hardmask layer using the nanoparticle reversal mask.

Figure 11:
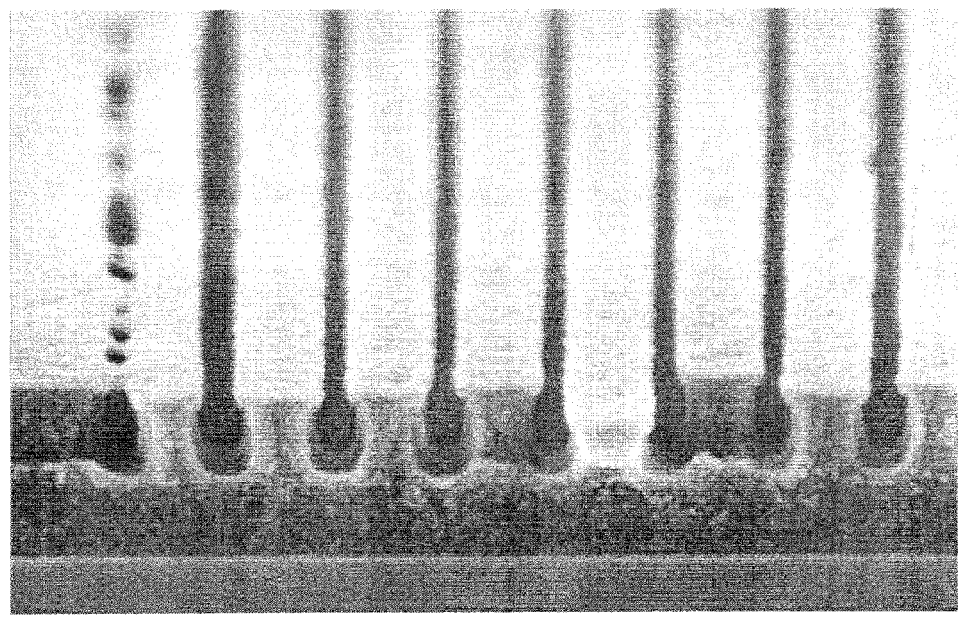
FIG. 11 is an SEM photograph showing a cross-sectional view of the substrate after etching of the reversed image into the spin-on carbon layer as described in Example 9.

Next, etching was continued into the spin-on carbon layer by switching to $O_2$ ($O_2$—50 sccm; power—100 W; pressure—100 mTorr) for 60 seconds. As shown in the SEM photograph in FIG. 11, the pattern was transferred into the spin-on carbon layer.

We claim:

1. A method of forming a microelectronic structure, said method comprising:
   (a) providing a wafer stack, said stack comprising:
      a substrate having a surface;
      one or more intermediate layers optionally formed on the substrate surface; and
      a patterned imaging layer on the intermediate layers, if present, or on the substrate surface if no intermediate layers are present, wherein said patterned imaging layer comprises a plurality of features, said features each being defined by sidewalls and a top surface;
   (b) applying a pattern reversal composition to said patterned imaging layer to form a pattern reversal mask, wherein said pattern reversal composition is substantially non-polymeric, said composition comprising nanoparticles dispersed in a solvent system, wherein said nanoparticles are selectively deposited between said features during said applying and adjacent said sidewalls without overcoating said top surfaces;
   (c) removing said patterned imaging layer to yield a reversed pattern comprising said mask; and
   (d) transferring said reversed pattern into said intermediate layers, if present, or into said substrate if no intermediate layers are present.

2. The method of claim 1, wherein said providing (a) comprises:
   providing a substrate having a surface;
   optionally forming one or more intermediate layers on said substrate surface;
   applying a photosensitive composition to form an imaging layer on said intermediate layers, if present, or on said substrate surface if no intermediate layers are present; and
   patterning said imaging layer to yield said patterned imaging layer.

3. The method of claim 2, wherein said patterning comprises:
   exposing said imaging layer to radiation to yield exposed portions of said imaging layer; and
   contacting said imaging layer with a developer so as to remove said exposed portion.

4. The method of claim 1, wherein said stack comprises one or more intermediate layers, said intermediate layers being selected from the group consisting of anti-reflective layers, spin-on carbon (SOC) layers, amorphous carbon layers, hardmask layers, planarization layers, and combinations thereof.

5. The method of claim 1, wherein said features are selected from the group consisting of lines, spaces, pillars, trenches, holes, and combinations thereof.

6. The method of claim 1, wherein said features have respective feature sizes ranging from about 5 nm to about 100 nm.

7. The method of claim 1, wherein said applying (b) comprises spin coating said pattern reversal composition onto said patterned imaging layer.

8. The method of claim 1, wherein said nanoparticles are selected from the group consisting of silica, alumina, $Sb_2O_5$, $ZrO_2$, $HfO_2$, $TiO_2$, $ZnO_2$, and mixtures thereof.

9. The method of claim 1, wherein said nanoparticles have an average particle size of less than about 10 nm.

10. The method of claim 1, wherein said nanoparticles comprise a metal oxide coating selected from the group consisting of alumina, $Sb_2O_5$, $ZrO_2$, $HfO_2$, $TiO_2$, $ZnO_2$.

11. The method of claim 1, wherein said solvent system contains a solvent selected from the group consisting of water, propylene glycol methyl ether acetate, propylene glycol monomethyl ether, ethyl lactate, propylene glycol n-propyl ether, gamma-butyrolactone, cyclohexanone, and cyclopentanone, mesitylene, methyl iso-butyl carbinol (MIBC), and mixtures thereof.

12. The method of claim 1, wherein said solvent system contains water and at least one co-solvent selected from the group consisting of propylene glycol methyl ether acetate, propylene glycol monomethyl ether, ethyl lactate, propylene glycol n-propyl ether, gamma-butyrolactone, cyclohexanone, and cyclopentanone, and mixtures thereof.

13. The method of claim 1, wherein no etching occurs prior to removal of the imaging layer in (c).

14. The method of claim 1, wherein said removing (c) comprises contacting the imaging layer with a solvent.

15. The method of claim 1, wherein said removing (c) comprises etching said imaging layer.

16. The method of claim 1, wherein said removing (c) comprises:
   blanket exposing said imaging layer to radiation; and
   contacting said blanket-exposed imaging layer with a developer so as to remove said imaging layer.

17. The method of claim 1, wherein said reversed pattern comprises reversed features selected from the group consisting of trenches, holes, pillars, lines, spaces, and combinations thereof.

18. The method of claim 17, wherein said reversed features have a feature size of from about 5 nm to about 100 nm.

19. The method of claim 1, wherein said transferring (d) comprises etching said reversed pattern into said intermediate layers, if present, or into said substrate if no intermediate layers are present using said pattern reversal mask as an etch mask.

20. A method of forming a microelectronic structure, said method comprising:

(a) providing a wafer stack, said stack comprising:
   a substrate having a surface;
   one or more intermediate layers optionally formed on the substrate surface; and
   a patterned imaging layer on the intermediate layers, if present, or on the substrate surface if no intermediate layers are present, wherein said patterned imaging layer comprises a plurality of features, said features each being defined by sidewalls and a top surface;
(b) applying a pattern reversal composition to said patterned imaging layer to form a pattern reversal mask, said composition comprising nanoparticles dispersed in a solvent system;
(c) without altering said pattern reversal mask, removing said patterned imaging layer to yield a reversed pattern comprising said mask; and
(d) transferring said reversed pattern into said intermediate layers, if present, or into said substrate if no intermediate layers are present.

21. A method of forming a microelectronic structure, said method comprising:
(a) providing a wafer stack, said stack comprising:
   a substrate having a surface;
   one or more intermediate layers optionally formed on the substrate surface; and
   a patterned imaging layer on the intermediate layers, if present, or on the substrate surface if no intermediate layers are present, wherein said patterned imaging layer comprises a plurality of features, said features each being defined by sidewalls and a top surface;
(b) applying a pattern reversal composition to said patterned imaging layer to form a pattern reversal mask, said composition comprising nanoparticles dispersed in a solvent system, wherein said nanoparticles are selectively deposited between said features during said applying and adjacent said sidewalls without overcoating said top surfaces, and wherein said solvent system contains a solvent selected from the group consisting of water, propylene glycol methyl ether acetate, propylene glycol monomethyl ether, ethyl lactate, propylene glycol n-propyl ether, gamma-butyrolactone, cyclohexanone, and cyclopentanone, mesitylene, methyl iso-butyl carbinol (MTBC), and mixtures thereof;
(c) removing said patterned imaging layer to yield a reversed pattern comprising said mask; and
(d) transferring said reversed pattern into said intermediate layers, if present, or into said substrate if no intermediate layers are present.

* * * * *